(12) United States Patent
Veerasamy et al.

(10) Patent No.: US 9,604,877 B2
(45) Date of Patent: *Mar. 28, 2017

(54) METHOD OF STRENGTHENING GLASS USING PLASMA TORCHES AND/OR ARC JETS, AND ARTICLES MADE ACCORDING TO THE SAME

(75) Inventors: Vijayen S. Veerasamy, Ann Arbor, MI (US); Xuequn Hu, Northville, MI (US); Glenn A. Cerny, Canton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 1206 days.

This patent is subject to a terminal disclaimer.

(21) Appl. No.: 13/137,697

(22) Filed: Sep. 2, 2011

(65) Prior Publication Data

US 2013/0059087 A1    Mar. 7, 2013

(51) Int. Cl.
*C23C 14/48*        (2006.01)
*C03C 23/00*        (2006.01)
(Continued)

(52) U.S. Cl.
CPC .......... *C03C 23/006* (2013.01); *C03C 21/007* (2013.01); *C03C 23/0055* (2013.01);
(Continued)

(58) Field of Classification Search
CPC . C03C 21/007; C03C 23/0055; C03C 23/006; C03C 25/607; C03C 25/626;
(Continued)

(56) References Cited

U.S. PATENT DOCUMENTS 3,505,048 A * 4/1970 Plumat .................... C03B 15/02
                                                      204/280
3,645,710 A * 2/1972 Plumat et al. ............... 65/30.13
(Continued)

FOREIGN PATENT DOCUMENTS

CN          101535194 A     9/2009
DE          69 181          5/1969
(Continued)

OTHER PUBLICATIONS

E.J. Hellund; The Plasma State; Reinhold publishing Corporation; 1961 (no month), excerpt pp. 11-15.*
(Continued)

*Primary Examiner* — Marianne L Padgett
(74) *Attorney, Agent, or Firm* — Nixon & Vanderhye P.C.

(57) ABSTRACT

Certain example embodiments relate to an improved method of strengthening glass substrates (e.g., soda lime silica glass substrates). In certain examples, a glass substrate may be chemically strengthened by creating an electric field within the glass. In certain cases, the chemical tempering may be performed by surrounding the substrate by a plasma including certain ions, such as $Li^+$, $K^+$, $Mg^{2+}$, and/or the like. In some cases, these ions may be forced into the glass substrate due to the half-cycles of the electric field generated by the electrodes that formed the plasma. This may advantageously chemically strengthen a glass substrate on a substantially reduced time scale. In other example embodiments, an electric field may be set in a float bath such that sodium ions are driven from the molten glass ribbon into the tin bath, which may advantageously result in a stronger glass substrate with reduced sodium content.

10 Claims, 10 Drawing Sheets

(51) Int. Cl.
*C03C 25/60* (2006.01)
*C23C 16/513* (2006.01)
*C03C 25/62* (2006.01)
*C03C 21/00* (2006.01)

(52) U.S. Cl.
CPC ........ *C03C 25/607* (2013.01); *C03C 25/6286* (2013.01); *C23C 14/48* (2013.01); *C23C 16/513* (2013.01)

(58) Field of Classification Search
CPC .............. C03C 25/6266; C03C 25/628; C03C 25/6286; C03C 25/6293; C23C 16/513; C23C 14/48
USPC ....... 427/527, 531, 533, 535, 540, 562, 564, 427/580, 446–456; 65/30.13, 30.14; 219/121.36, 121.47–121.59
See application file for complete search history.

(56) References Cited

U.S. PATENT DOCUMENTS

| | | | |
|---|---|---|---|
| 3,730,696 A | | 5/1973 | Pointu et al. |
| 3,741,739 A | | 6/1973 | Baker |
| 3,755,684 A | | 8/1973 | Plumat et al. |
| 3,879,183 A | * | 4/1975 | Carlson .................. C03C 23/00 204/164 |
| 4,824,458 A | * | 4/1989 | Ettori .................... C03C 21/007 65/111 |
| 4,983,255 A | * | 1/1991 | Gruenwald et al. ............ 134/1.1 |
| 5,144,110 A | * | 9/1992 | Marantz et al. .......... 219/121.48 |
| 5,426,003 A | * | 6/1995 | Spengler et al. ............. 429/489 |
| 5,780,371 A | | 7/1998 | Rifqi et al. |
| 5,781,878 A | * | 7/1998 | Mizoguchi ......... G01N 27/4175 701/109 |
| 6,001,426 A | * | 12/1999 | Witherspoon .......... B05B 7/224 219/121.47 |
| 6,083,355 A | * | 7/2000 | Spence ................... B29C 59/14 204/164 |
| 6,114,649 A | * | 9/2000 | Delcea ..................... 219/121.52 |
| 6,329,628 B1 | * | 12/2001 | Kuo ..................... B23K 10/006 219/121.47 |
| 6,368,664 B1 | * | 4/2002 | Veerasamy et al. ........ 427/249.7 |
| 8,502,108 B2 | * | 8/2013 | Mohamed ................ H05H 1/24 219/121.5 |
| 9,478,401 B2 | * | 10/2016 | Maschwitz ........... C23C 16/402 |
| 2004/0057692 A1 | * | 3/2004 | Ball et al. ..................... 385/142 |
| 2004/0233537 A1 | * | 11/2004 | Agrawal ................. B60R 1/088 359/604 |
| 2005/0016456 A1 | * | 1/2005 | Taguchi ............... H05H 1/2406 118/723 E |
| 2007/0232066 A1 | * | 10/2007 | Bicker et al. ................. 438/689 |
| 2010/0047554 A1 | | 2/2010 | Rajala et al. |
| 2010/0264306 A1 | * | 10/2010 | Rorrer, III .......... G01N 27/624 250/282 |
| 2013/0059160 A1 | * | 3/2013 | Veerasamy et al. .......... 428/428 |
| 2016/0102014 A1 | * | 4/2016 | Hu .......................... C03C 3/093 428/220 |

FOREIGN PATENT DOCUMENTS

| | | |
|---|---|---|
| EP | 1 870 387 A1 | 12/2007 |
| EP | 2 371 779 A1 | 10/2011 |

OTHER PUBLICATIONS

U.S. Appl. No. 13/137,696, filed Sep. 2, 2011; Veerasamy et al.
U.S. Appl. No. 13/137,698, filed Sep. 2, 2011; Veerasamy et al.
J.P. Boeuf, et al, "Contribution of Positive and Negative Ions to the Electrohydrodynamic Force in a Dielectric Barrier Discharge Plasma Actuator Operating in Air", Journal of Applied Physics 106, 023115 (2009), Jul. 29, 2009.
Arun K. Varshneya, "The Physics of Chemical Strengthening of Glass: Room for a New View", Journal of Non-Crystalline Solids 356 (2010) pp. 2289-2294, Journalhomepage; www.elsevier.com/locate/jnoncrysol, Jun. 4, 2010.
M. Forte, et al ; "Optimization of a Dielectric Barrier Discharge Actuator by Stationary and Non-Stationary Measurements of the Induced Flow Velocity: Application to Airflow Control"; Exp Fluids (2007) 43: pp. 917-928; Research Article; Received Mar. 8, 2007/Revised: Jun. 29, 2007/Accepted: Jul. 16, 2007/published Online: Aug. 1, 2007; Springer-Verlag 2007.
International Search Report mailed Jun. 4, 2013.
International Search Report mailed Feb. 13, 2013.
"Dielectric Barrier Discharges Used for the Conversion of Greenhouse Gases: Modeling the Plasma Chemistry by Fluid Simulations"; Bie et al., Plasma Sources Science and Technology 20 (2011), Apr. 1, 2011 (pp. 1-11).
"Ion Exchange for Glass Strengthening"; GY; Materials Science Engineering B, Sep. 2008 pp. 159-165.

* cited by examiner

PULSE MODE ION IMPLATATION

METHOD OF STRENGTHENING GLASS USING PLASMA TORCHES AND/OR ARC JETS, AND ARTICLES MADE ACCORDING TO THE SAME

Certain example embodiments relate to an improved method of strengthening glass substrates (e.g., soda lime silica glass substrates). In certain examples, a glass substrate may be chemically strengthened by creating an electric field within the glass. In certain cases, the chemical tempering may be performed by surrounding the substrate by a plasma including certain ions, such as $Li^+$, $K^+$, $Mg^{2+}$, and/or the like, with such ions being forced into the glass substrate as a function of the half-cycles of the electric field generated by the electrodes that formed the plasma. In certain example embodiments, an electric field may be set in a float bath such that sodium ions are driven from the molten glass ribbon into the tin bath, which may advantageously result in a stronger glass substrate with reduced sodium content.

BACKGROUND AND SUMMARY OF CERTAIN EXAMPLE EMBODIMENTS

Soda lime silica glass has many desirable properties in a wide range of conditions including, for example, good transparency and clarity, high durability, etc. However, in some cases, the degree of mechanical strength of soda lime silica glass may depend upon the presence of (i) flaws in the glass originating at fabrication; and/or (ii) surface flaws that develop as the surface of the glass corrodes over time, which may cause a so-called "blistering" at the glass surface. These surface flaws sometimes may become more significant as the surface area to volume ratio of a piece of glass increases (e.g., for thinner articles of glass). While sodium dioxide ($NaO_2$) may be used to help reduce the melting point of glass during its manufacture in certain circumstances, the presence of $Na^+$ ions in a glass article (and particularly toward the surface/near surface area of the glass article) may have a negative impact on the chemical and/or mechanical durability of the article in some cases.

For example, in certain cases, $Na^+$ ions may cause soda lime silica glass to deteriorate in quality. This may occur in a two-stage process in some cases. The first stage may be an ion-exchange process between $H^+$ and/or $H_3O^+$ ions from moisture that penetrates the surface of the soda lime silica glass and an alkali metal ion (e.g., $Na^+$) that is removed from the glass. At this stage, the silica network may remain unchanged, but an alkaline film of or including NaOH and $H_2O$ may form at the glass surface. In some examples, the film may become increasingly alkaline, as more moisture penetrates the surface of the glass and reacts with the sodium ions near the surface of the glass. In certain cases, if and/or when the pH reaches approximately 9 or higher (e.g., as the film becomes increasingly basic), the second stage may occur. The second stage may include decomposition of the silica network, which may lead to the formation of nano-cracks that may, in turn, potentially weaken the glass substrate.

Furthermore, glass strength may sometimes be controlled by the size of the "worst" or most severe defect (e.g., cracks and/or nano-cracks), which may vary from sample to sample. In certain cases, the surface nano-cracks and/or other flaws in soda lime silica glass (e.g., created by the reaction between $Na^+$ ions and moisture and/or those present because of other factors) may act as "stress concentrators." In some cases, less stress may be needed for the crack to become bigger, spread, and/or break the glass substrate because these nano-cracks are present in the first place. Additionally, because these cracks may form near the surface of the glass (e.g., because of the reaction of sodium ions and moisture to form an alkaline "coating" near the surface of the glass), the surface of the glass may be particularly prone to damage from lower amounts of stress than normal (e.g., more prone than a crack-free portion of soda lime silica glass).

In some general cases, the larger the crack, the lower the stress required for the crack to propagate. The potentially large number of flaws may cause the glass to fracture more easily than it normally would. In some cases, unstrengthened glass may fracture at stresses that are 5, 10, or even 100 times lower than the theoretical strength of the glass, e.g., because of the presence of cracks/nano-cracks. This may make it difficult to accurately predict the amount of stress a glass substrate may be subjected to before the glass will crack, fracture, and/or break. This variability in the strength of glass substrates having similar compositions and thicknesses may lead to increased accidental breakage and/or increased production costs, e.g., related to having to produce a glass substrate of higher strength than necessary to be "safe." Indeed, there may be about 25% variability in the stresses that could cause glass substrates of similar compositions and thicknesses to crack, fracture, and/or break.

In other words, the amount of stress required to cause different glass substrates of similar composition and thickness to crack, fracture, and/or break may vary. The amount of stress that causes one substrate to fracture may not fracture a second substrate of similar composition and thickness. In some cases, it may be necessary to increase the thickness of glass because of the possible combination of low overall strength and high strength variability, if glass is to be used at all. Thus, in some cases, the use of soda lime silica glass as an engineering material may be limited by issues arising from these flaws, such as its brittle fracture behavior, strength variations, and/or its low effective strength under normal use conditions.

As the application of thin glass becomes more widespread (e.g., in the electronics market), factors such as mechanical hardness, resistance to marring and scratching, as well as thermal stability, become potentially more important considerations.

Thus, it will be appreciated that there is a need for improving the surface and/or near-surface properties of glass so that it may be sufficiently durable while maintaining and/or improving its other desirable properties (e.g., electronic grade, transparency, etc.).

There currently are several methods that may be employed to strengthen soda lime silica glass, namely, thermal (e.g., mechanical) heat treatment (e.g., heat strengthening and/or thermal tempering) and chemical tempering. Heat treating, for example, typically involves heating a glass substrate, and cooling the hot surface more rapidly than the interior. This creates compressive stress near the surface, which is balanced and/or offset by tensile stress toward the interior. Chemical tempering, on the other hand, involves an ion-exchange process. In certain chemical tempering implementations, larger ions are substituted for smaller ions at the surface of the glass. This process is sometimes referred to as "ion stuffing." Both techniques may induce a compressive stress in the surface of the glass substrate in some instances.

A stress profile shows the relative amount and type of stress present in the substrate at various points. FIGS. 1(a)-(b) are illustrative stress profiles for each of the two techniques described above. More particularly, FIG. 1(a)

illustrates a cross-section of a glass substrate, showing the residual stress profile caused by thermally strengthened glass.

As discussed above, heat treating (e.g., heat strengthening and/or thermal tempering) for glass involves strengthening the glass by altering the stress of the glass. In some cases, thermal tempering methods will build up and/or increase a residual compressive stress state at the surface of a glass substrate, and up to a certain depth below the surface. This residual compressive stress state is equilibrated and/or balanced by a tensile stress state in at least some of the internal portions of the glass. FIG. 1(a) illustrates the compressive stress at the surface and/or near-surface portion(s) $100(a)$ of substrate $1(a)$, and the tensile stress toward the interior portion $101(a)$ of substrate $1(a)$. As can be seen from FIG. 1(a), the stress of interior portions of a glass substrate that has been mechanically strengthened (e.g., heat treated) may be tensile, in certain cases.

FIG. 1(b), on the other hand, illustrates the cross-section of a glass substrate that has been chemically tempered. In FIG. 1(b), while substrate $1(b)$ has compressive stress in areas $100(b)$ at/near its surface, the compressive stress does not penetrate as deeply into the surface, and the tensile stress in the interior portion $101(b)$ of the glass substrate $1(b)$ is lower than glass substrate $1(a)$ that was thermally tempered. When a glass substrate is chemically tempered, the composition of the surface and/or near-surface regions of the substrate is changed. $Na^+$ ions may be removed in certain cases, and thus the silica network of the glass substrate generally will not be as susceptible to damage related to reactions between $Na^+$ ions and external moisture.

A disadvantage of thermal tempering is that in some cases it may not be used effectively for thin glass (e.g., glass that is approximately or less than 1.5 mm in thickness) because it may cause surface wrinkling and/or warping. Further, thermal tempering may sometimes lose efficacy as the glass gets thinner. In other examples, thermal tempering may not achieve the same level of "temper" as in chemical tempering. However, chemical tempering may take a very long to sufficiently strengthen a glass substrate (e.g., hours as opposed to minutes).

Thus, although thermal and chemical tempering may be advantageous in certain instances, those skilled in the art will appreciate that there is a need for faster ways to better strengthen a glass substrate (e.g., for thick and thin substrates).

In certain example embodiments, a method for increasing the strength of a glass substrate is provided. A plasma is struck using at least one plasma source and first and second electrodes disposed on opposing major surfaces of a glass substrate, wherein the plasma comprises replacement ions. The replacement ions are driven into the opposing major surfaces of the glass substrate so as to increase the strength of the glass substrate.

In certain example embodiments, a method of using plasma to strengthen a glass substrate comprising sodium ions is provided. A plasma is struck using at least one plasma source and first and second electrodes disposed on opposing major surfaces of a glass substrate, with the plasma comprises positive ions. An electric field is used to drive the positive ions into the at least one major surface of the glass substrate so as to replace at least some of the sodium ions and increase the strength of the glass substrate.

In certain example embodiments, a chemically-strengthened glass article comprising soda lime silica glass is provided. The article comprises at least one of potassium, lithium and magnesium plasma-implanted replacement ions in a surface region of the glass article. The surface region extends from a major surface of the glass article to a depth of at least about 5 microns, more preferably at least about 7 microns, and sometimes at least about 50 microns. At least some of the replacement ions have replaced sodium ions such that the glass article has fewer sodium ions than a glass article that has not been chemically strengthened. The glass article has a strength of at least about 200 MPa, and more preferably at least about 400 MPa.

In certain example embodiments, a method for increasing the strength of a glass substrate is provided. At least one plasma torch comprising at least first and second electrodes is disposed on at least a first major surface of a glass substrate. A plasma comprising replacement ions is sprayed through a nozzle of the plasma torch via an applied electric field between the two electrodes such that the plasma is sprayed proximate the first major surface of the glass substrate. The replacement ions are driven into the at least one major surface of the glass substrate so as to increase the strength of the glass substrate.

In certain example embodiments, a method for strengthening a soda lime silica glass substrate is provided. First and second plasma torches or arc jets are disposed on opposing major surfaces of a glass substrate. A plasma comprising replacement ions is sprayed onto the opposing major surfaces of the glass substrate via each plasma torch or arc jet. The replacement ions are driven into the first and second major surfaces of the glass substrate by virtue of electric fields between the first and second electrodes of each plasma torch or arc jet, so as to increase the strength of the glass substrate.

In certain example embodiments, a method of making a glass substrate is provided. Opposing major surfaces of a soda lime silica glass substrate are exposed to plasmas containing ions, the soda lime silica glass substrate at least initially including 10-20 wt. % $Na_2O$. Electrodes associated with the plasma are selectively activated to drive the ions, directly or indirectly, into surface regions of the glass substrate and force sodium ions out from the surface regions to reduce $Na_2O$ content of the glass substrate to less than 10 wt. %.

In certain example embodiments, a method of making a glass substrate is provided. A plasma is struck in a tin bath section of a float line at least over a molten glass ribbon, with the plasma acting as a positive electrode and the tin bath acting as a negative electrode. Sodium ions are driven out of the molten glass ribbon and into the tin bath via an electric field created by the positive and negative electrodes and at least partially present in the molten glass ribbon. The glass substrate is allowed to be formed, with the glass substrate having less than 20 wt. % $Na_2O$.

In certain example embodiments, a method of making a glass substrate is provided. A molten glass ribbon is provided in a tin bath portion of a float line via at least one plasma. Sodium ions are driven out of the molten glass ribbon and into the tin bath so as to reduce the sodium ion-content of the molten glass ribbon. The glass ribbon is maintained at one or more temperatures high enough such that the glass ribbon remains in a molten state, even as the composition of the glass ribbon changes, in making the glass substrate.

In certain example embodiments, a strengthened glass substrate comprises a silicate matrix, wherein the matrix comprises at least some argon atoms and wherein the glass substrate is substantially depleted of sodium ions and has a strength of at least about 600 MPa, and more preferably at least about 1000 MPa.

In certain example embodiments, a method of making a glass substrate is provided. Alumina is driven into molten glass, and sodium is forced out of the molten glass, via at least one plasma including alumina. The molten glass is pulled in making the glass substrate.

In certain example embodiments, a strengthened glass substrate comprises less than 10 wt. % $Na_2O$ and at least one type of ion selected from the group consisting of potassium, lithium and magnesium ions. At least some of the ions have replaced sodium ions originally present in a glass ribbon leading up to the glass substrate. The glass article has a strength of at least about 400 MPa.

These and other embodiments, features, aspect, and advantages may be combined in any suitable combination or sub-combination to produce yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF CERTAIN EXAMPLE EMBODIMENTS

As explained above, it may be desirable in certain instances to make thin glass substrates of improved durability, e.g., that are "electronic grade." In addition, it may be desirable in certain cases to make improved glass starting from an imperfect stock of soda lime silica glass. Indeed, it sometimes may be more cost-effective to treat soda lime silica glass in a manner that renders it more durable and/or strong, rather than to manufacture an inherently stronger glass such as borosilicate glass and/or the like. In order to help overcome the comparatively lower strength of soda lime silica glass, and make it thinner, stronger, and/or electronic grade, it may be desirable to alter certain properties of the surface and/or near-surface region(s) of a glass substrate. Thus, for example, sodium ions that may disadvantageously react with moisture to degrade a glass substrate may be reduced and/or replaced in certain example embodiments.

Figures 1A, 1B:
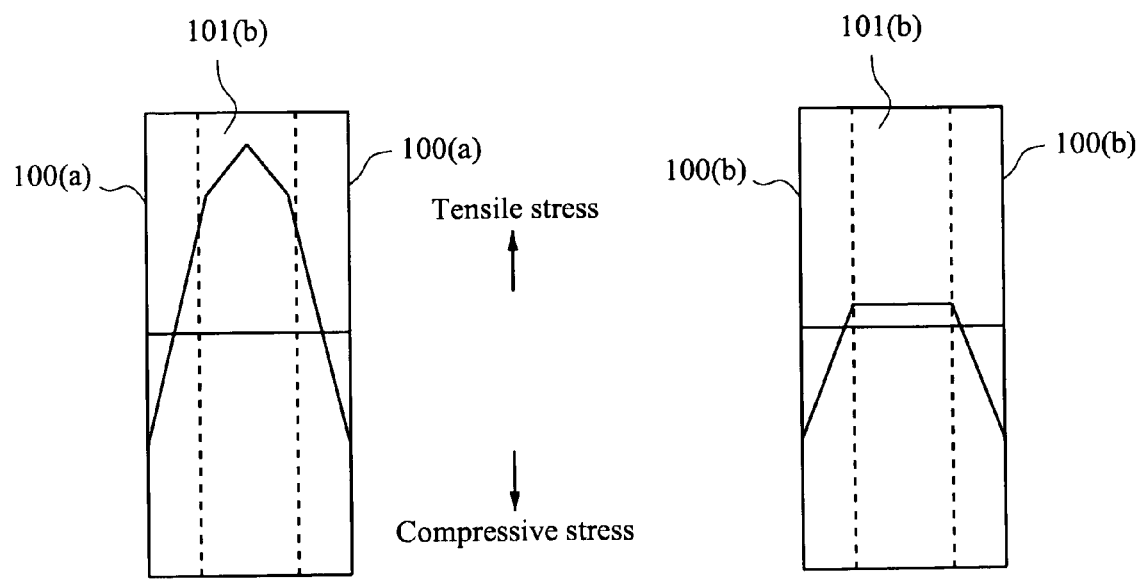
FIGS. 1(a)-(b) show example stress profiles for mechanically (e.g., heat) strengthened and chemically tempered glass substrates, respectively.
Figure 2A:
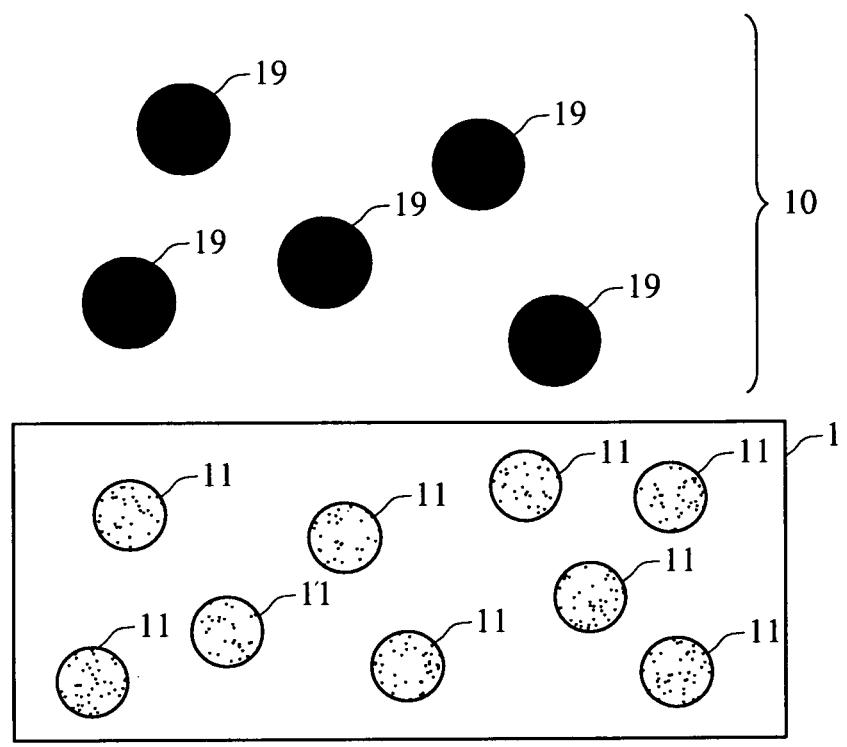
FIGS. 2(a)-(b) help demonstrate certain chemical tempering principles.
Figure 2B:
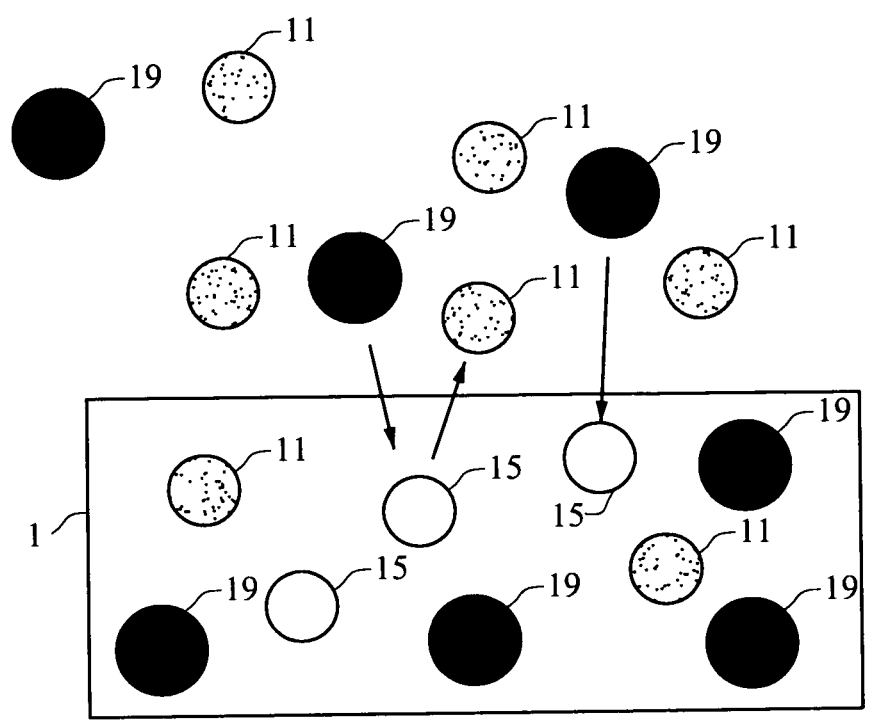

FIGS. 2(a) and 2(b) help demonstrate certain chemical tempering principles. As explained above, the general concept of chemical tempering involves removing and/or replacing some of the sodium ions in the glass substrate (particularly those in the surface and/or near-surface region) with other replacement ions. The replacement ions may be larger than and/or less reactive than the sodium ions. In some cases, the replacement ions may include potassium, lithium, and/or magnesium. In certain example embodiments of this invention, replacement ions may comprise these ions and/or other divalent ions, multivalent ions, alkali metals, silver, and/or other appropriate materials. In certain cases, the replacement of sodium ions may also change the stress profile near the surface of the glass substrate.

FIGS. 2(a) and 2(b) also help illustrate the ion exchange between the surface and/or near-surface area of the glass substrate and the ions in the molten salt bath. FIG. 2(a), for instance, sows sodium ions 11 in a portion of glass substrate 1. Replacement ions 10 (potassium ions 19 may be used as replacement ions 10, in certain cases). Potassium (for example) ions 19 are shown outside of the glass substrate, at least initially. Potassium ions 19 are in the molten salt bath, as is substrate 1 (though only a portion of the salt bath and a portion of the substrate are illustrated). FIG. 2(b) illustrates how sodium ions 11 in glass substrate 1 are replaced with potassium ions 19. The arrows in FIG. 2(b) show a sodium ion 11 leaving the surface/near-surface region of substrate 1, and indicate that sodium vacancies 15, where sodium ions 11 once were, may be replaced by potassium ions 19. In some cases, ions 19 may be an ion/compound besides potassium (e.g., another salt). FIGS. 2(a) and 2(b) are simply illustrative of how smaller (or in other example embodiments, perhaps more reactive rather than smaller) ions 11 are replaced with ions 19 in substrate 1, when the substrate is in a molten salt bath.

The ion exchange process (e.g., as illustrated in FIG. 2(b), for example) may be diffusion-limited in certain instances. The ion exchange process performed in a molten salt bath also typically is a slow process. Accordingly, it may take a long time for a sufficient exchange of ions to take place.

The ion exchange process generally involves a mutual ion diffusion mechanism so as to meet the principle of charge neutrality (e.g., the sum of positive charges generally must equal the sum of negative charges), since no electron current is involved in some cases. In other words, if the $Na^+$ ions in the substrate are replaced by ions in the molten salt bath through diffusion forces only, the process may take many hours. The replacement of a substantial amount of $Na^+$ ions via a molten salt bath, with no additional forces at work aside from diffusion, may take an extremely long time.

An equation that may be used to express the depth to which the replacement ions may permeate the glass substrate ($L_{exc}$) may be expressed as a function of the diffusivity of a material (e.g., diffusion coefficient D), which is the degree to which a material allows passage of a gas or fluid, and the temperature of the glass substrate T, as well as the time t in which the substrate is immersed in the bath.

For instance, $L_{exc} \cong \sqrt{D_k(T)^*t} \cong 50$ μm for a 400 MPa temper state (e.g., where the strength of the chemically tempered glass is such that compressive stress on the surface of the glass is approximately 400 MPa). However, in other examples, a 400 MPa strength may be reached with depths of about 7 microns.

The lower limit of time (t) is typically temperature (T) dependent. In other words, the time it takes to sufficiently strengthen the glass substrate via an ion exchange in a molten salt bath may decrease as the temperature increases. However, extremely high temperatures may be necessary even to achieve the aforesaid temper strength in four hours. Although four hours is a long time, at less extreme temperatures, in some instances, it may take up to 16 (or even more) hours for a sufficient strength to be reached. For instance, in some cases, $t_{upper} \cong L^2/D_k \cong 4$ hours. This may be limited by Fick's laws which, for example, relate to the direction of diffusive flux with respect to concentration, and how diffusion causes the concentration to change with time.

By chemically tempering a glass substrate in a molten salt bath, a glass substrate may reach a strength of about 400 MPa. However, as can be seen from the above, it may take approximately four hours for replacement ions to reach an implanted depth of 50 microns at high temperatures, and up to 16 hours or longer at lower (e.g., more "reasonable") temperatures. Although the ions may be implanted to shallower depths (e.g., about 7 microns), using a molten salt glass to achieve a strength of around 400 MPa may still take 25 hours. If the desired strength is greater than 400 MPa, and/or the desired depth of implantation is 100 microns or greater, the process of strengthening glass via a molten salt bath may take 16 hours or more. Accordingly, in certain scenarios, the length of the time that it takes to chemically strengthen a sheet of glass using ions in a molten salt bath may not be ideal and/or feasible for larger-scale production.

As alluded to above, certain strengthening techniques may involve an ion-exchange process that operates via a physical mechanism; e.g. the thermal diffusion of ions. However, in some cases, an electric field may be superimposed, e.g., on the glass substrate. In certain example cases, the presence of an electric field in the salt bath and/or glass substrate may produce an index change by altering the glass density, stress, and/or mean polarizability.

In certain instances, the application of an electric field may increase the velocity and/or speed of the replacement ions in the salt bath, and may decrease the time necessary for sufficient replacement (and thus strengthening). This is believed to be a result of the application of a field-effect assisted ion exchange that may provide an additional force for the transport of ions from a molten salt. Thus, ions that otherwise may be difficult to exchange by random, thermal motion (e.g., divalent ions and/or other larger, heavier ions) may thus be used to replace sodium in glass, in cases where an electric field is used.

More specifically, ions used in a molten salt bath to replace sodium ions in a glass substrate may move only because of the diffusion current (e.g., manifested via thermal and/or density gradients) that results from the random Brownian motion of charge carriers independent of electrical stimulus. On the other hand, if an electric field is applied, the ions may move because of the drift current. Drift current is the electric current, or movement of charge carriers, that is caused by the applied electric field, often stated as the electromotive force over a given distance.

Thus, providing replacement ions and producing an electric field to assist the speed at which the replacement ions penetrate the glass surface and replace the sodium ions is desirable and advantageous in certain example instances. However, it sometimes may be difficult to generate an electric field of a sufficient magnitude to substantially speed up the replacement process, particularly because electrodes to generate an electric field in and/or near the glass substrate may need to be placed in the salt bath and may need to directly contact the surface of the glass substrate. In order for such contact to be successful and/or possible, the glass substrate may need to be in the solid, rather than molten, state. On the other hand, the glass may need to be maintained in its molten state so as to permit a more efficient exchange rate of sodium ions and replacement ions. Thus, the use of an electric field of a sufficient magnitude may not be possible when the glass substrate is in a molten state; and similarly, the speed/velocity of the replacement ions (and thus the overall chemical tempering process) may require that the glass is in a molten state. Accordingly, these two scenarios for small increases in chemical tempering speed may be mutually exclusive.

In some cases, using a glass in the molten state permits ions to be exchanged efficiently, e.g., because of their high mobility when the glass is in that state (e.g., as explained by the Einstein relation). Two example cases of the relation are:

$$D = \frac{\mu_q k_B T}{q}$$

(diffusion of charged particles), and $$D = \frac{k_B T}{6\pi\eta r}$$

(as in the "Einstein—Stokes equation" for diffusion of spherical particles through liquid with low Reynolds number),
where:
D is the diffusion constant,
q is the electrical charge of a particle,
$\mu_q$ is the electrical mobility of the charged particle, or the ratio of the particle's terminal drift velocity to an applied electric field,
$k_B$ is Boltzmann's constant,
T is the absolute temperature,
$\eta$ is viscosity, and
r is the radius of the spherical particle.

$$D = \frac{\mu_q k_B T}{q} = \frac{k_B T}{6\pi\eta r} \text{ so } \mu_q = \frac{q}{6\pi\eta r}.$$

Thus, as can be seen from the above diffusion-related equations, as the viscosity of a material decreases (e.g., as the material becomes less viscous), the electrical mobility of a charged particle will increase. Accordingly, when the glass is in a molten state, the viscosity will be lower, so the charge mobility will be higher. Thus, when a glass substrate is in the molten state, the ion-exchange process may be faster. An electric field, however, may further increase the rate of ion exchange. Unfortunately, as alluded to above, in order to maintain an electric field within and/or near the glass substrate, electrodes may need to be physically placed on the glass substrate in certain situations. In order for this to be possible, the glass may need to be in a solid state.

Using an electric field (e.g., in the order of 100 V/cm) with a glass substrate in a molten salt bath may permit ions to reach a speed of from about 1 to 4 m/s in some instances.

In some cases, ions at this speed may penetrate about 10 microns into the glass substrate. However, in certain cases, it may be desirable for ions to penetrate farther than 10 microns into the glass substrate. Moreover, it may not always be convenient and/or feasible to maintain a glass substrate in a molten state.

For example, in certain example ion exchange processes, the glass may be in a solid state (e.g., $T<T_g$, where $T_g$ is the temperature at which the glass becomes molten), and is immersed in a salt bath. To achieve approximately a 100 micrometer ion exchange depth may take as long as 5, 10, or 16 hours, or even longer (depending on the temperature).

In certain instances, to set up an electric field on the order of about 100 V/cm (e.g., 10,000 V/m), physical electrodes may be placed in the melt (molten bath) while the glass is in a solid state. Again, in certain instances, placing physical electrodes in a molten salt bath while the glass is in a solid state may present an obstacle to applying a drift current (e.g., the electric current, or movement of charge carriers, which is related to the applied electric field, often stated as the electromotive force over a given distance) to expedite ion exchange. In other words, to sufficiently apply an electric field, the glass may be in a solid state. Conversely, the ions will move faster when the glass is in a molten state, because the charge mobility is inversely proportional to viscosity, in certain cases. Furthermore, in some cases, DC electric field-assisted ion exchange may only provide exchange to one surface of the glass.

It therefore will be appreciated by those skilled in the art that there exists a need for a more efficient method of chemically tempering a glass substrate. It may be desirable to find a method to more efficiently replace sodium ions with replacement ions utilizing an electric field, and/or when the glass is in a solid state. Furthermore, it would be advantageous to reduce the time scale necessary for performance of chemical strengthening.

It has advantageously been found that the techniques disclosed herein may permit the ionic make up of the surface and/or near-surface region (e.g., a thin, epitaxial layer) of a glass substrate to be tuned and/or modulated significantly faster than previous methods of mechanical and/or chemical tempering. In certain exemplary embodiments, the composition of the surface and/or near-surface region of a soda lime silica glass substrate may be tuned and/or modulated on a time scale that is at least one order of magnitude lower than other methods. In certain example embodiments, a glass substrate may be strengthened in a matter of minutes rather than hours (or even days).

In the molten salt ion exchange described above, the molten salt supplies the replacement ions for the sodium ions in the glass. However, certain example embodiments relate to methods and/or techniques of creating a high and substantially uniform electric field in and/or at the surface of a glass substrate in different "state scenarios" (e.g., solid, molten, etc.). As described above, in some cases, creating a high electric field may require metal electrodes to physically be placed in a molten salt bath. These techniques may be limited in terms of large areas of glass, and may also be limited by the state of the glass.

Figure 3:
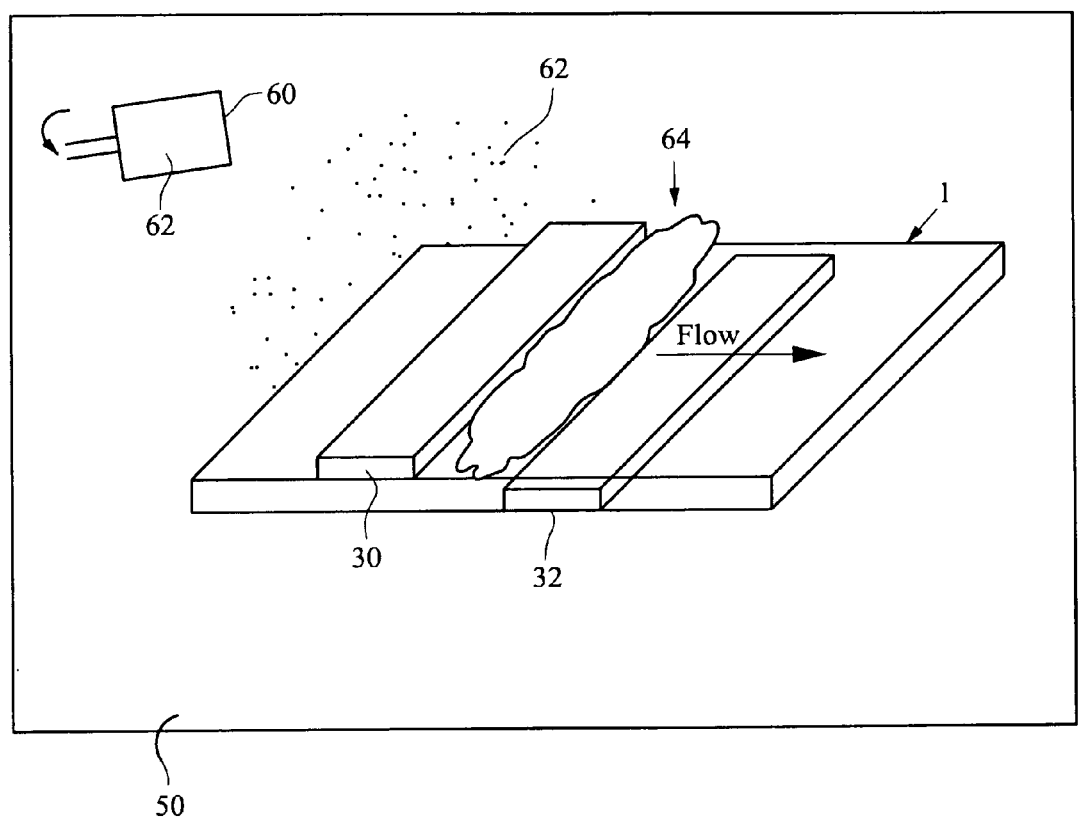
FIG. 3 helps demonstrate how a glass substrate can be chemically strengthened by using plasma as an electrode and a replacement ion source in accordance with certain example embodiments.
Figure 4:
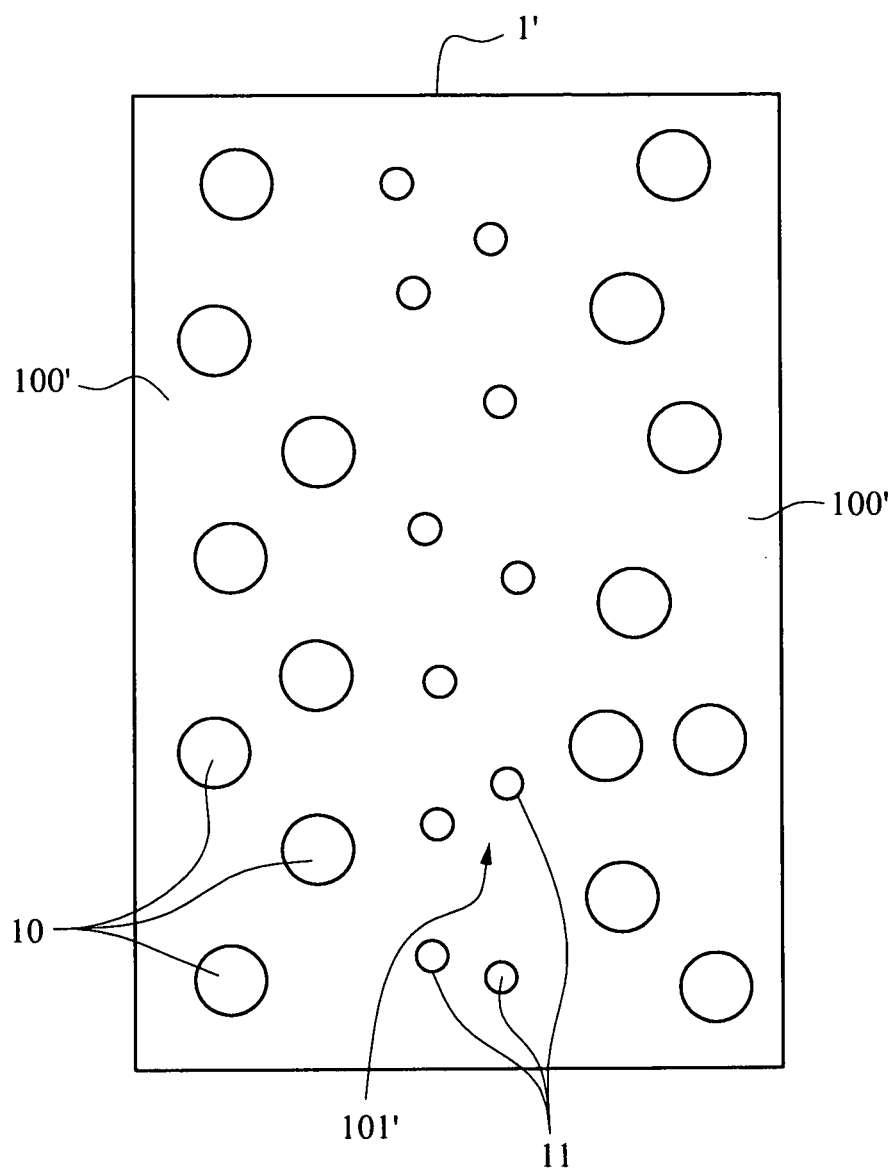
FIG. 4 illustrates an enlarged cross-section of a chemically strengthened glass substrate according to certain example embodiments.

By contrast, in certain example embodiments, it has advantageously been found that plasma may be used as an electrode to set up a time-varying electric field within the glass. In certain cases, an electric field (e.g., AC, DC, RF, etc.) may be superimposed to drive faster ion-exchange strengthening using different techniques to strengthen the glass more quickly. In some cases, the electric field may have a net varying modulated basis. In a first example embodiment, replacement ions may be introduced to a glass substrate by vaporizing the replacement ions in a plasma that serves the purpose of electrodes, by setting up an electric field in and/or around the glass substrate. The glass substrate to be chemically tempered can be visualized as being immersed within the capacitively coupled or glow discharge or electrostatic discharge plasma for example, as shown in FIG. 3. A chemically strengthened glass substrate produced in accordance with certain example embodiments is shown in FIG. 4, which is described in further detail below.

The plasma may serve several purposes according to different example embodiments. For example, the plasma may heat up the glass, provide a source of replacement ions to reach the glass surface, and/or provide electrons to complete the displacement current. In certain example embodiments, the glass substrate may not need to be heated. Instead, the plasma may operate to increase the temperature of the substrate, particularly in the surface and/or near-surface regions of the glass substrate. In some cases the glass may act as a capacitor. The plasma may also act in a manner such that it capacitively couples to the glass. The friction between the positive ions and the electrons in the plasma near the glass substrate may cause the glass temperature to rise, in certain cases. The plasma may heat the glass substrate via ohmic losses in certain examples.

FIG. 3 illustrates glass substrate 1 in chamber 50, with upper electrode 30 and lower electrode 32. In certain example instances, upper and lower electrodes 30 and 32 may operate with radio frequency (RF) and/or alternating current (AC) voltage. The frequency and voltage of the electrodes may be of any suitable type according to other example embodiments (such as DC, for example), however. Plasma source 60 may provide chamber 50 with a plasma precursor 62 (e.g. an inert gas; air with an entrailment of vaporized ionic species based on salt chemistries of certain monovalent, divalent and/or multivalent species (e.g., $Li^+$, $K^+$, and/or $Mg^{2+}$ based compounds; and/or the like). Electrodes 30 and 32 may be used to create an electric field which, in turn, will strike a plasma from the plasma precursor 62. The pressure of chamber 50 may be at atmospheric pressure, on the order of atmospheric pressure, and/or at sub-atmospheric pressure in different example embodiments. For example, the pressure may be less than or equal to 760 Torr (1 atm), less than or equal to 380 Torr (0.5 atm), and possibly even about 500 millitorr or less in different example implementations. In certain example embodiments, the chamber may be at or near vacuum, although other atmospheric pressures are possible as indicated above.

The atmosphere may further include other elements in different example embodiments. For example, the atmosphere may include one or more inert gases, such as argon, krypton, neon, and the like.

In certain example embodiments, the electrodes may create an electric field that, in turn, may create a plasma 64 from the plasma precursor 62. In certain example embodiments, an electric field may be present in the glass substrate. The plasma precursor 62 may include salt species such as $Li^+$, $K^+$, and/or $Mg^{2+}$ in certain example embodiments. In certain example embodiments, the efficiency of producing a plasma may be increased or maximized at or near the Stoltow point, at which a substantially uniform, large-volume plasma is realized. The Stoltow point is the point at which ionization happens with a reduced energy requirement. In certain cases, the power approximately varies with the cube of the applied voltage, but the induced (current) flow can saturate.

The glass substrate may be located between the upper and lower electrodes (and thus, within the plasma), in certain examples. To enable an increased flexibility in treatment conditions, the electrodes 30 and 32 may advantageously be designed so as to move independently in x and/or y (and possibly even z) directions so as to permit changes in the plasma field as needed during processing. For instance, the electrodes 30 and 32 may scan linearly or non-linearly in a computer-controlled pattern across the substrate 1 in x and/or y directions. Because of the dielectric nature of a glass substrate, the glass substrate may act as an insulator. The presence of the glass substrate in the plasma may create a positively charged sheath at and/or above the upper and below the lower surfaces of the glass substrate.

In certain example embodiments, the ions may be deposited as a layer on the glass surface and/or be driven directly or indirectly into the glass by the net field and the (possibly alternating) current. In certain example embodiments, in a plasma ion exchange, a thin film of at least temporarily deposited replacement ions ($Li^+$, $K^+$, $Mg^{2+}$, etc.) may supply the replacement ions with the aid of an applied net electric field sustained by the plasma sheath on one or both sides of the glass. In certain cases, this "thin film" may be an aspect of the plasma, and not a physical film deposited on the glass substrate. In other example embodiments, however, a thin film of or including the aforesaid replacement ions may be formed on one or both sides of the glass substrate to further facilitate the ion exchange/ion stuffing process.

In certain examples, in the thin film technique, mixed ions such as $K_2SO_4$, $Li_2SO_4$, $MgSO_4$, and/or the like, may form the thin film. In different cases, sulfate salts, halide salts, and/or other types of salts may be used to supply the replacement ions. The thin-film ion exchange process may start with the production of a thin coating (for example, 100-150 nm in thickness) of ionic material on one or both sides of a glass substrate, in certain cases. In further examples, the glass may have been cleaned and/or polished prior to cleaning. In other example embodiments, as indicated above, the thin film of replacement ions may simply include the positive ions from the sheath that forms on each side of the substrate.

In certain example embodiments, the sodium ions may be driven out, and the replacement ions may fill the vacancies left by the sodium ions. In some cases, the replacement ions may advantageously be bigger than the sodium ions (e.g., and induce a compressive stress to strengthen the glass substrate) and/or may be less reactive than the sodium ions such that the replacement ions are less likely to react with moisture and the like in the surface/near-surface region of the glass substrate as readily as the sodium ions would.

The ion exchange may be performed by applying a varying electric field, e.g., that is in some cases asymmetric enough to produce a net field of from about 20 to several hundred (or even higher) V/mm. For example, the net electric field may be from about 20 to 500 V/mm ($2 \times 10^4$ to $5 \times 10^5$ V/m), more preferably from about 50 to 300 V/mm ($5 \times 10^4$ to $3 \times 10^5$ V/m), and most preferably from about 100 to 200 V/mm ($1 \times 10^5$ to $2 \times 10^5$ V/m).

In certain example embodiments, the net electric field may produce a few microamperes. In some cases, this may drive the ions from the thin film and/or the sheath into the glass. After the ion exchange, residual ions remaining on the glass surface may be removed, e.g., by washing. In certain example embodiments, other ions such as silver may be used to modulate the refractive index of the glass substrate. Other ions may be used in the plasma in different example embodiments.

In certain exemplary embodiments, where alternating current (AC) is used, the AC may permit neutralization by electrons in the plasma. In these examples, the electric field may keep the ions moving into the glass which may, in turn, help prevent ions from being reduced and/or forming nanocrystals at the surface of the glass. In certain examples, the net field may prevent agglomeration and haze. In some cases, sodium may also be leached in the plasma by reacting with anionic species.

In further examples, the positive ions in the plasma near the glass substrate's major surfaces may be electrically driven by the electric field into the surface of the glass substrate during each of the half cycles of the respective electrodes (e.g., AC electrodes). In other words, in certain example embodiments, glow discharge (e.g., at atmospheric pressure) using a dielectric barrier discharge, may induce fluid flow. Further, in some cases (e.g., when AC is used), there may be two processes in the two half-cycles of the electrical driving operation. In certain examples, this may be related to the difference in mobility between faster electrons and slower (positive) ions, and the geometric configurations of the actuator insulator and electrodes.

In certain example embodiments, the first half-cycle may be characterized by the deposition of the slower ion species (e.g., $K^+$, $Li^+$, $Mg^{2+}$, etc.) on a first major surface of the glass substrate (e.g., with the glass substrate acting as an insulator). The second half-cycle may be characterized by the deposition of the electrons at a faster rate. Once the energetic (positive) ions to be exchanged fall on the glass surface, they may be driven into the glass surface by the electric field in the sheath, with a high drift speed. In certain example embodiments, the drift speed may be in the order of about 10 m/s. The drift speed may be at least about 1 m/s, more preferably at least about 5 m/s, even more preferably at least about 10 m/s, and most preferably at least about 25 m/s, according to different example embodiments. In some cases, a power-law dependence on the voltage for the resulting force may be observed in the glass. This may indicate that a larger force can be generated by increasing the amplitude in certain examples.

In other example embodiments, the effectiveness of the actuator may be enhanced using several techniques. A first way to enhance the effectiveness of the actuator is to increase the peak value of the periodic force generation. A second way to enhance the effectiveness is to increase the asymmetry between the voltage half-cycles. In certain instances, one and/or both of those techniques may be utilized. The first example approach for enhancing the effectiveness of the actuator, increasing the peak value of the periodic force generation, may comprise increasing the size of the lower electrode 32, increasing the applied voltage, and/or increasing the dielectric constant, in certain example embodiments. The second example approach for enhancing the effectiveness of the actuator, increasing the asymmetry between voltage half-cycles, may comprise decreasing the frequency of applied voltage, in other example embodiments. However, the complex interplay between the above factors may determine the actuator performance in driving ions at/into the glass surface(s). In certain example embodiments, sodium vacancies may be created, and those vacancies may then be filled by replacement ions (e.g., $K^+$, $Li^+$, $Mg^{+2}$, etc.)

The following equations describe certain properties of the ions being driven into the surface of the glass substrate. For example, an equation for boundary conditions, e.g., for the current continuity at the interface (e.g., between the glass surface and the plasma), may be:

$$\frac{d(\varepsilon_{gas}E_{gas})}{dt} + \frac{e}{\varepsilon_o(n_iV_i - n_eV_e)} = \frac{d(\varepsilon_{glass}E_{glass})}{dt}$$

where $\varepsilon$ represents permittivity (for gas and then glass) and E represents electric field (in the gas then in the glass), e is Euler's number, $\varepsilon_0$ is the electric constant that relates the units for electric charge to mechanical quantities such as length and force, $n_i$ is the density of the ions, $n_e$ is the density of the electrons, $v_i$ is the velocity of the ions, and $v_e$ is the velocity of the electrons.

In certain example embodiments, once the replacement ions (e.g., $K^+$, $Li^+$, $Mg^{2+}$, etc.) reach the glass surface, they may be driven into the glass at the consecutive half-cycles by the drift term in the Grad function in the sheath of the plasma. An energy function of electric field E that may creates more sodium vacancies that are then filled by the positive replacement ions is described below.

$$\frac{\delta f}{\delta t} = \nabla_v \cdot \left(f \nabla_v \frac{\delta E}{\delta f}\right)$$

For some Energy Functional E: $f \rightarrow E(f)$

In certain example embodiments, the gradient flow may reduce entropy. A generalized formula for nano-porous media (e.g., glass with sodium vacancies) may be:

$$\frac{\delta \rho}{\delta t} = \Delta_x \rho^m + \nabla_x \cdot (\rho x)$$

In certain example embodiments, the ions may be driven into the glass substrate to a depth of from about 1 to 1,000 microns, preferably at least about 5 microns, more preferably the ions are implanted to a depth of at least about 7 to 15 microns, even more preferably from about 30 to 900 microns, and most preferably from about 50 to 200 microns. However, in some cases, the desired strength may be accomplished with ions implanted to a depth of only about 5 to 15 (e.g., 7) microns. In certain example embodiments, the thickness of the glass substrate may be related to the depth of implantation necessary to achieve a particular strength.

The depth to which the ions are driven into the glass substrate may be achieved on the first "pulse" from a half-cycle, or may be the result of multiple pulses, e.g., with each pulse driving the ion further and further into the glass substrate. In certain example embodiments, the electrodes 30 and 32 may be alternatively actuated, e.g., so that more and more ions are stuffed into the substrate faster than they can escape. In certain example embodiments, the implanted ions may have a substantially normal Gaussian, Poisson, or other distribution.

FIG. 4 illustrates an enlarged cross-section of a chemically strengthened glass substrate according to certain example embodiments. Replacement ions 10 have replaced at least some of the sodium ions 11 in the surface and/or near surface regions of chemically strengthened substrate 1'. Replacement ions 10 may include potassium, lithium, magnesium, other alkali metal ions, silver, argon, and/or the like. At least some sodium ions 11 may remain in the interior portion 101'. However, in certain example embodiments, they are at a great enough distance from the surface region of the glass substrate so that they present less of a threat to the strength and/or durability of the glass substrate.

In certain example embodiments, the chemical strengthening according to example embodiments described herein may produce an increase in the strength of the glass to at least about 200 MPa, more preferably at least about 400 MPa, and most preferably at least about 600 MPa. In other example embodiments, the resulting strength of a glass substrate that is chemically tempered utilizing plasma may have a strength of from about 200 to 800 MPa, more preferably from about 400 to 600 MPa, and most preferably a strength of at least about 400 MPa, in different example embodiments.

This increase in strength may be accomplished in from about 30 seconds to 30 minutes, more preferably about 1 to 20 minutes, and most preferably in about 2 to 10 minutes, with an example amount of time being about 5 minutes, but possibly even less. However, the glass may be strengthened for more or less time according to different example embodiments.

In some cases, salts based on halides may produce clouding on a glass surface. However, halide salts may be used in connection with certain example embodiments. For instance, divalent and/or multivalent halide salts may be used in the plasma in certain example embodiments. In some cases, binary and ternary sulfate salts may advantageously produce clear crystallized surface layers of beta quartz solid solution. The salts of sulfates (e.g., $K_2SO_4$, $Li_2SO_4$, etc.), and/or $MgSO_4$, nitrates, halogens (halides), and/or other precursors including potassium, lithium, and/or magnesium may also be used certain examples. Other alkali metals may be used in other embodiments. The precursor materials and/or replacement ions are not so limited and other materials may be used in different example embodiments.

Figure 5:
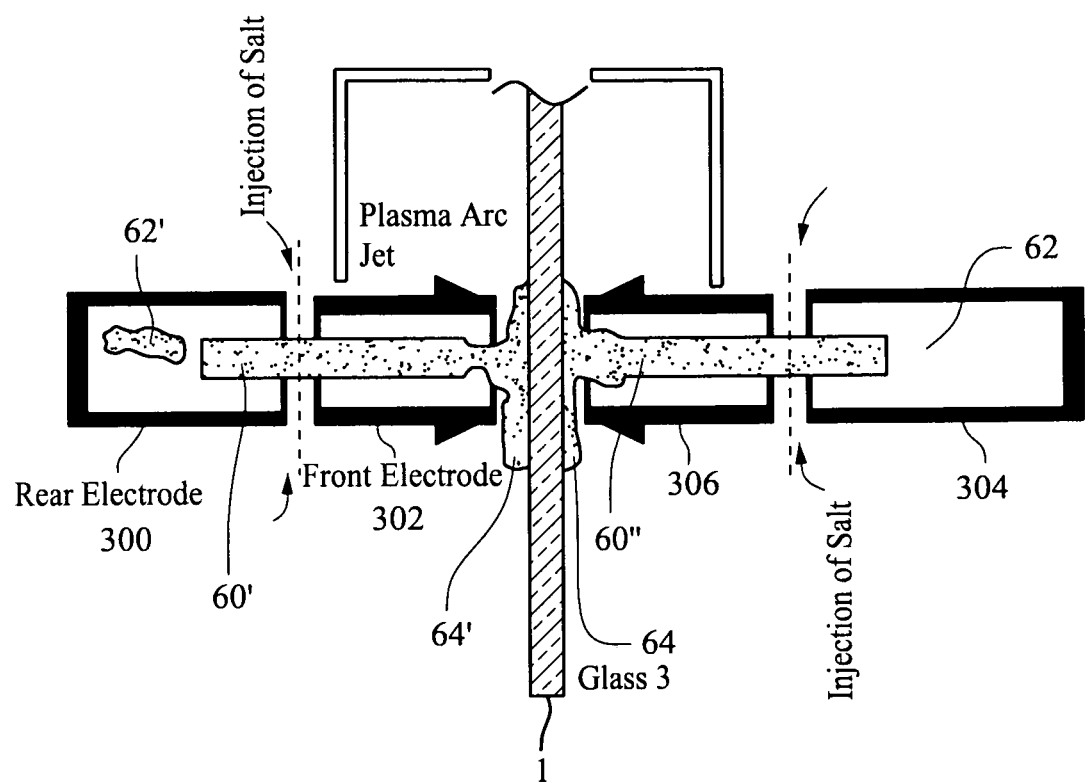
FIG. 5 helps demonstrate how one or more plasmas may be used to supply replacement ions when chemically strengthening a glass substrate in accordance with certain example embodiments.

FIG. 5 helps demonstrate how one or more plasmas may be used to supply replacement ions when chemically strengthening a glass substrate in accordance with certain example embodiments. The FIG. 5 example embodiment is somewhat similar to the FIG. 4 example embodiment. In FIG. 5, a plasma torch (e.g., with an arc jet) is used as the plasma source. Plasma torches/sources are shown schematically and designated with reference numerals 60' and 60" in FIG. 5. Example plasma torches are described in U.S. Pat. Nos. 5,998,757 and 6,329,628, which are hereby incorporated by reference. However, any plasma torch and/or plasma arc jet may be used in connection with different example embodiments.

In certainexample embodiments, e.g., such as in FIG. 5, the chemical strengthening system may include electrodes on one or both sides of the glass. FIG. 5 illustrates first rear and front electrodes 300 and 302 on a first major surface of the glass substrate. Second rear and front electrodes 304 and 306 are on the opposing major surface of the glass substrate in the FIG. 5 example embodiment. In other example embodiments, however, more or fewer electrodes may be used on one or both sides of the substrate. FIG. 5 also illustrates plasma precursors 62 and 62' and plasmas 64 and 64' being sprayed proximate the major surface(s) of the glass substrate 1.

In certain example embodiments, the net electric field may be from about 20 to 500 V/mm ($2\times10^4$ to $5\times10^5$ V/m), more preferably from about 50 to 300 V/mm ($5\times10^4$ to $3\times10^5$ V/m), and most preferably from about 100 to 200 V/mm ($1\times10^5$ to $2\times10^5$ V/m). In certain examples, the pressure at which the plasma torch is used may be atmospheric pressure, on the order of atmospheric pressure, and/or at sub-atmospheric pressure in different example embodiments. The example atmospheres and/or pressure identified above also may be used in connection with the FIG. 5 example embodiment or embodiments similar to it.

In certain example embodiments, as the glass substrate moves through the opening between the electrodes, the ions from the plasma will be driven into the surface areas of each major surface of the glass substrate. In certain example embodiments, plasma torches may be provided on each side of the glass article to be chemically tempered (e.g., one and/or more than one on each side). In other example embodiments, a plasma source (e.g. plasma torch) may be provided on only one side of the glass substrate. The salts of sulfates, nitrates, halogens (halides), and/or other precursors including potassium, lithium, and/or magnesium may be sprayed into the injector stage of the plasma torch in certain example embodiments. However, other alkali metals may be used in other embodiments. The precursor materials for the plasma and/or replacement ions used in this embodiment may be the same as those used in other embodiments described herein. Further, the atmosphere may further contain Argon or other suitable inert gas(ses).

In certain example embodiments, once vaporized, the ions may be accelerated through the nozzle of the plasma torch by an applied electric field between the two electrodes. The high temperature of the torch may vaporize the material and spray it onto the glass in certain example embodiments. The high electric field may permit the ions to be driven into the glass surface in the order of 100 micrometers in about five minutes or less in some cases.

For instance, the ions may be driven into the glass substrate to a depth of from about 1 to 1,000 microns, preferably at least about 5 microns, more preferably the ions are implanted to a depth of at least about 7 to 15 microns, even more preferably from about 30 to 900 microns, and most preferably from about 50 to 200 microns with an example depth being about 100 microns below the surface of the glass substrate. However, in some cases, the desired strength may be accomplished with ions implanted to a depth of only about 5 to 15 (e.g., 7) microns. . The depth to which the ions are driven into the glass substrate may be achieved on the first "pulse" from a half-cycle, or may be the result of multiple pulses, e.g., with each pulse driving the ion further and further into the glass substrate. In embodiments where two or more plasma torches are included, the plasma torches may be activated together (e.g., at the same or substantially the same time), in an alternating pattern, or in some other computer-controlled fashion.

In certain example embodiments, this plasma torch embodiment may or may not involve ion implantation, as the amplitude of voltage involved may or may not be high enough to implant ions at a depth of at least about 100 microns, which in certain example embodiments may be desirable when attempting to strengthen the glass. In certain cases (e.g., where implanting ions is not feasible or possible), the wave form may be used to progressively push the ions into the glass on the positive pulse, so that with each pulse, the ions are driven a bit further into the glass substrate until they reach an acceptable depth (e.g., at least about 100 microns). In some cases, corrective actions may be taken on the negative pulse to help ensure that the surface of the glass does not charge up to the plasma potential or higher. However, in some cases, an acceptable strength may be achieved with an implantation depth of from about 5 to 15 microns.

In certain example embodiments, the chemical strengthening according to example embodiments described herein may increase the strength of the resulting glass substrate to at least about 200 MPa, more preferably at least about 400 MPa, and most at least about 600 MPa. In other example embodiments, the strength of a resulting glass substrate that is chemically tempered utilizing plasma may have a strength of from about 200 to 800 MPa, more preferably from about 400 to 600 MPa, and most preferably a strength of at least about 400 MPa, in different example embodiments.

This increase in strength may be accomplished in from about 30 seconds to 30 minutes, more preferably about 1 to 20 minutes, and most preferably in about 2 to 10 minutes, with an example timeframe of approximately 5 minutes. However, the glass may be strengthened for more or less time according to different example embodiments.

The dynamic fluence or flux may be adjusted by the linear speed of the substrate in some examples.

In other example embodiments, the plasma torch may be used to create a gradient in a surface region of a glass substrate. In some cases, by altering the type of ion (e.g., by altering the type of salt, sulfate, other precursor, etc.) injected into the plasma torch, or by alternating plasma torches with different precursors, a surface region of a glass substrate at a first depth may be treated so as to include a particular type of replacement ion, and then may be treated with another torch and/or type of precursor so as to include a different type of replacement ion at a second lesser depth, and so on. An example of a glass substrate with this type of gradient is illustrated in FIG. 6.

Figure 6:
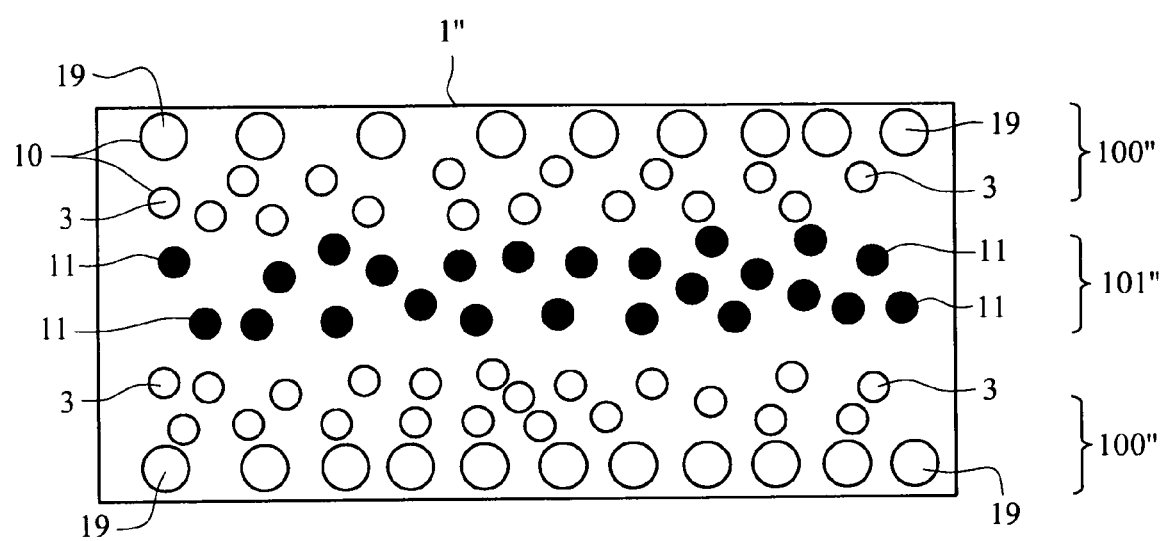
FIG. 6 illustrates an enlarged cross-section of a chemically strengthened glass substrate, including an ion gradient, according to certain example embodiments.

FIG. 6 shows a cross-section of chemically strengthened glass substrate 1" produced in accordance with certain example embodiments. In FIG. 6, interior portion 101" of substrate 1" still include sodium ions 11. However, surface and/or near-surface regions 100" include replacement ions 10, which may include first replacement ions 3 and second replacement ions 19. As can be seen from FIG. 6, first replacement ions 3 (which may be $Li^+$, $K^+$, $Mg^{2+}$, and/or the like) were first driven into the surface region of substrate 1", and have replaced some sodium ions. Then, after first replacement ions were driven into the surface region, second replacement ions 19 were driven into the surface region. Thus, substrate 1" has a gradient with respect to replacement ions. This gradient may contain as many internal "sub-layers" as desired, according to different example embodiments. Moreover, the gradient may only be created in one major surface region of the glass substrate. Further, the number of internal sub-layers and the composition of those sub-layers may vary for the different surfaces of the substrate in some embodiments. In certain exemplary embodiments, chemically strengthening a glass substrate so as to include a gradient may be particularly advantageous for curved substrates. However, a gradient may be included in substantially planar substrates, as well. In certain example embodiments, the gradient may be such that particle size decreases towards the center of the substrate, or vice versa. In other cases, the gradient may vary in other ways, e.g., from large to small to large (etc.), or vice versa.

Figure 7:
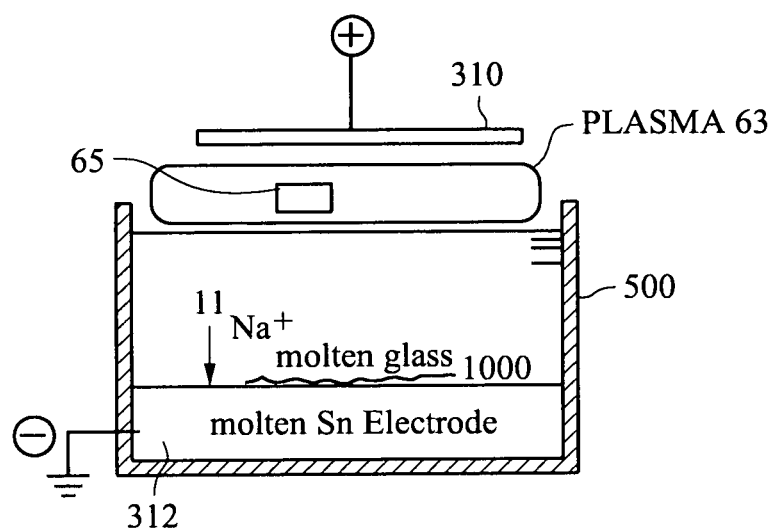
FIG. 7 helps demonstrate how a glass substrate can be chemically strengthened using a plasma along a float line in accordance with certain example embodiments.

Another example embodiment relating to chemically strengthening glass substrates involves extracting and/or depleting sodium from a molten soda float line. FIG. 7 illustrates an example of this approach, in which the glass ribbon has been altered so as to extract and/or deplete sodium from the soda lime silica float glass (e.g., a melt) as it passes through (e.g., over) the tin bath. In the FIG. 7 embodiment, the sodium ions extracted and/or depleted from the glass may not be replaced by other ions. Rather, the ions may simply be removed in some cases. The sodium may be forced out of the float glass/melt, and may be absorbed by the tin in the tin bath. This may advantageously produce a silicate glass containing less sodium that conventional soda lime silica glass. In certain example embodiments, the silicate glass formed may be substantially free of sodium (e.g., may contain less than 20 wt. % $Na_2O$, more preferably less than 15 wt. % $Na_2O$, still more preferably less than 10 wt. % $Na_2O$, and possibly 1-5 wt. $Na_2O$). In some embodiments, Argon and/or other gases present in the atmosphere of the float bath may end up in the glass substrate. However, this may not affect the strength and/or other properties of the glass in certain cases; particularly when the gases are inert.

FIG. 7 shows a tin bath portion of a float line in accordance with certain example embodiment. In certain example embodiments, a dielectric barrier discharge (DBD) plasma may be set up above a molten glass float (e.g., above a glass ribbon and/or melt) in the tin bath portion of the float line. In some cases, the atmosphere may be of or include an inert gas. In certain exemplary examples, an electric field may be set up through the float. In cases such as this, the electrodes may be the plasma and the tin bath. In certain examples, a high electric field (e.g., at least about 1000 V/m, more preferably at least about 2000 V/m, and most preferably at least about 5000 or even 10,000 V/m) may be set up in the glass ribbon. This may drive the sodium ions into the tin as a secondary electron emission from the glass. Positive plasma ions may also be incorporated into the ribbon to replace the sodium. In certain cases, this may produce a glass that is rich in quartz-like material(s).

More specifically, FIG. 7 illustrates a tin bath 312 in float line 500 that acts as an electrode, and plasma 63 that may act as another electrode. In certain example embodiments, the tin bath may be a negative electrode, and the plasma may be a positive electrode 310 itself or located proximate to a positive electrode. In some cases, a plasma is struck in the float line, above the tin bath.

As the molten glass ribbon 1000 moves through the tin bath, the tin acts as a negative electrode, and the plasma acts as a positive electrode, in certain example embodiments. Sodium ions are forced out of the glass ribbon, in certain instances. The sodium ions may be absorbed by the molten tin in the tin bath. In some instances, the sodium ions may be forced out of the glass ribbon in a substantially uniform and/or random manner. In other instances, one side of the glass may have a higher concentration of sodium ions than the other side. A "sided product" may, for example, be beneficial in certain post-coating applications.

In further example embodiments, the tin bath plasma may be used as a way of coating a glass substrate with other layers, as well. For example, in addition to strengthening, the float glass may be coated with layers so as to enhance environmental protection and/or other optical properties.

In certain example embodiments, the electric field may be DC rather than RF and/or AC, as the tin bath may remain the negative electrode, and the plasma may remain the positive electrode. In other example embodiments, however, other configurations may be possible.

In certain example embodiments, so long as the tin bath and/or float line comprise a closed chamber so as to contain the argon (and/or other ions in the plasma), the pressure need not be at a vacuum level. In some cases, the pressure may be similar to that typically used in a float line and/or tin bath (e.g., at or near atmospheric). In other embodiments, the pressure may be slightly lower. In further cases, it may be necessary or desirable to control the partial pressure of argon and/or any other replacement ions in the plasma.

In certain example embodiments, the plasma may comprise atoms such as argon. As the sodium ions are driven out of the glass ribbon, the argon atoms 65 may take the place of the sodium ions 11. In certain example embodiments, the resulting glass may be a silicate glass; e.g., glass comprising a silica matrix or silica matrices. In some cases, the glass (e.g., the silica matrix) may include argon. However, argon is inert, and therefore should not significantly adversely affect the properties of the glass substrate. In certain example embodiments, a silicate glass formed in this manner may have a strength of at least about 400 MPa, more preferably at least about 600 MPa, even more preferably at least about 800 MPa, and in certain exemplary embodiments, the resulting glass may have a strength of at least about (or even greater than) 1000 MPa.

In certain example embodiments, a level of strength enhancement from about 5 to 500 times the strength of unstrengthened glass, sometimes from about 7 to 250 times the strength of unstrengthened glass. Typically, it is possible to achieve a strength increase of at least about 10 to 100 times compared to the strength of unstrengthened glass. The treatment times necessary to achieve those levels of strengthening may be from about 1 second to 1200 seconds, more preferably from about 10 to 600 seconds, and most preferably from about 10 to 300 seconds. However, the glass may be strengthened for more or less time according to different example embodiments.

In certain example embodiments, the glass transition temperature $T_g$ (e.g., the temperature at which the glass reversibly transitions from a molten state to a hard and/or brittle state) may slowly rise as sodium is extracted. In some cases, this may cause rapid solidification of the ribbon. Though rapid solidification may be beneficial in certain example embodiments, to be cautious, the power to the float bath and/or ribbon may be externally increased in certain implementations so as to help raise the temperature of the float bath and/or ribbon. Further, the heating and cooling may be controlled as the ribbon is drawn. In further example embodiments, alumina-enriched glass may be used. The use of alumina-enriched glass may also advantageously counteract the rise in $T_g$ of the glass melt. That is, the plasma-based strengthening techniques of certain example embodiments may be used to create alumina-enriched glass (when Al-inclusive materials are provided in/to the plasma). Al-enriched glass (e.g., made with a vertical-pull technique) produced using the plasma-based techniques disclosed herein may have properties and/or characteristics similar to those found in Gorilla glass, which is commercially available from Corning. Al-enriched glass (e.g., made with a float method) produced using the plasma-based techniques disclosed herein additionally or alternatively may have properties and/or characteristics similar to those found in Dragontail glass, which is commercially available from Asahi. Such glass may be used in electronics-type applications in certain example implementations.

In other example embodiments, the plasma may comprise replacement ions such as alkali metals (e.g., $Li^+$, $K^+$, $Mg^{2+}$, etc.). As the sodium is driven out of the glass ribbon, the replacement ions in the plasma may take the place of the sodium ions. The resulting glass substrate would have a strength similar to that of the other methods of ion exchange as described herein. Furthermore, since this is occurring on the float line, in certain example embodiments, a substantial number of the sodium ions may be replaced by the replacement ions. In other words, a glass substrate strengthened in this manner may comprise replacement ions throughout its entire thickness, rather than just comprising replacement ions in a surface region.

Figure 8:
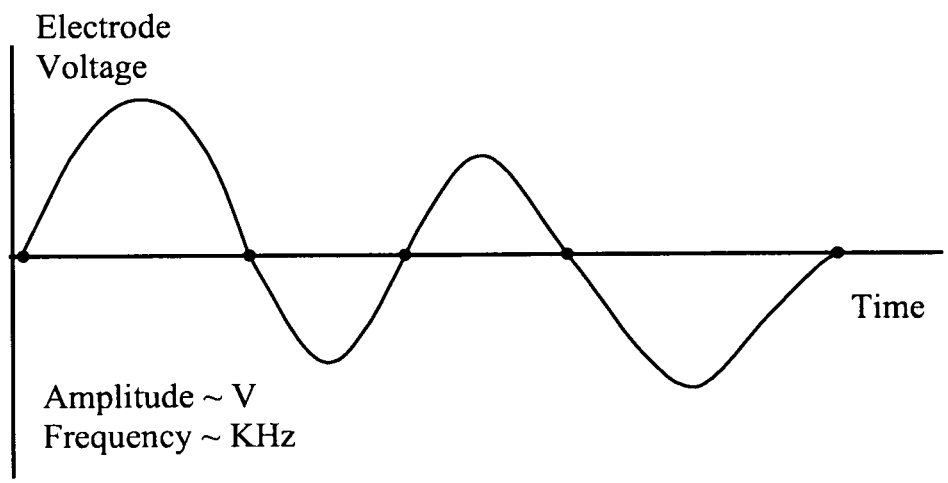
FIG. 8 is a graph of example electrode voltage versus time, which may be used in accordance with certain example embodiments.

FIG. 8 illustrates a graph of electrode voltage over time that may be used in some of the embodiments described herein. Particularly for AC and/or RF electrodes, FIG. 8 illustrates the voltage of an example electrode as time progresses. In certain example embodiments, the amplitude of an electrode may be from about 10 to 10,000V, more preferably from about 50 to 5,000 V, and most preferably from about 100 to 1,000V. In further examples, the corresponding frequency may be from about 0.25 KHz to about 500 KHz, more preferably from about 0.5 KHz to about 100 KHz, and most preferably from about 1 KHz to 50 KHz, according to different example embodiments.

Figure 9:
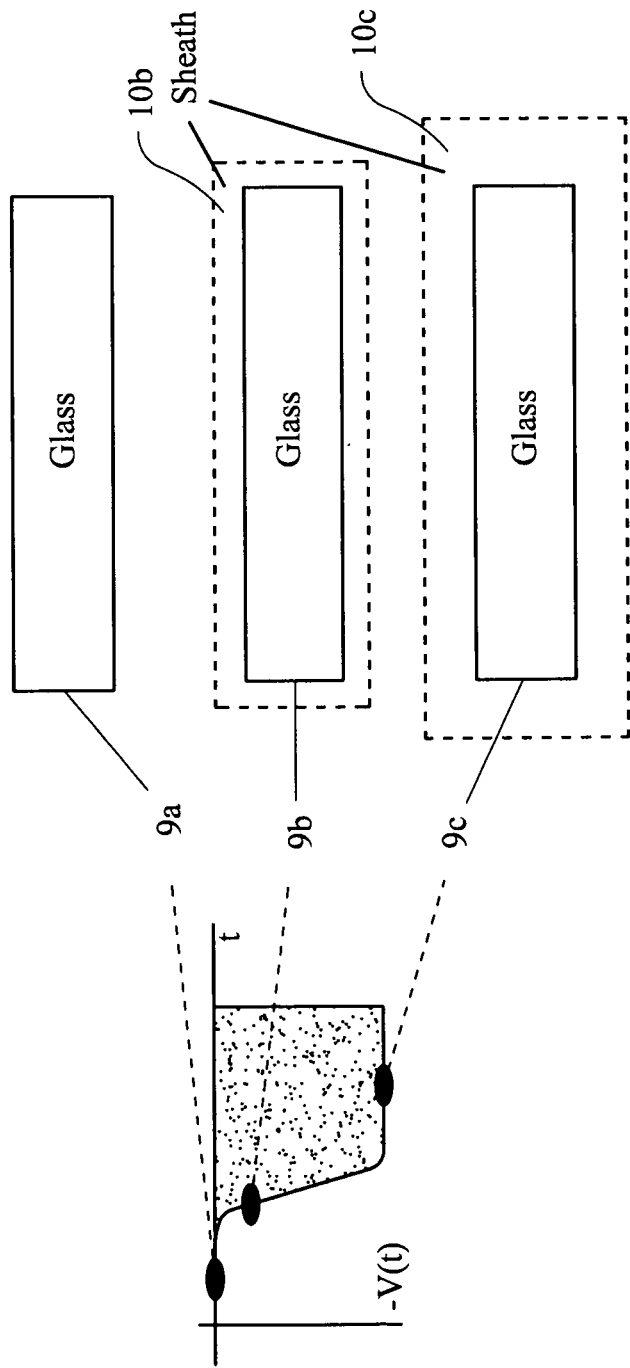
FIG. 9 illustrates a graph of voltage over time and the corresponding effects on the sheath surrounding the glass substrate, according to certain example embodiments.

In some example embodiments, the voltage may be pulsed. However, in other example embodiments, the voltage may be constant or have other characteristics/properties. When pulsed voltage is used, the sheath may expand as the pulse is applied. In certain examples, it may be advantageous to have a bigger sheath in that it may encompass more replacement ions. FIG. 9 illustrates the pulse. Graph 9 plots voltage v. time, and shows the magnitude of the voltage over time. At the point corresponding to 9a, no voltage has been applied, and there is no sheath around the glass, as can be seen in corresponding glass substrate 9a. At point 9b, when some voltage has been applied, the sheath 10b of corresponding substrate 9b is located very close to the glass substrate 9b. However, as the voltage increases, e.g., as shown at point 9c, the corresponding glass substrate 9c has sheath 10c that is yet larger than sheath 10b. In certain example embodiments, it may be advantageous to have a larger sheath such as 10c. In further examples, the fact that the sheath changes size may be advantageous.

It has advantageously been found that since the production methods proposed herein are available, said production methods may be adapted in mainstream float glass manufacturing processes.

In certain example embodiments, the glass substrates described herein may be cleaned and/or polished prior to strengthening.

While the electrodes and/or plasma have been described as being "on" or "supported by" the glass substrate, it will be understood by one skilled in the art that this may mean directly and/or indirectly on or supported by. While electrodes and/or plasmas may directly contact a glass substrate, they may also be spaced apart from the glass substrate in different embodiments.

The techniques disclosed herein may be used to strengthen glass substrates such as sheets of glass, but may also be used to strengthen other glass articles (e.g., fibers, rods, strips, squares, etc.). The glass substrates as described herein may be from about 0.01 to several centimeters in thickness, more preferably from about 0.01 to 10 mm, and most preferably less than about 2 mm in thickness.

The example embodiments described herein may be used to strengthen any type of glass substrate. For example, alumina-enriched glass may be strengthened by any of the disclosed example methods. Particularly, alumina-enriched glass substrates made by vertical pull methods and/or float line methods may be strengthened according to any of the example embodiments disclosed herein. In certain example embodiments, alumina-enriched glass substrates may be suitable for use in electronic applications. In particular, alumina-enriched plasma-strengthened glass may be particularly advantageous for use in electronic applications where increased durability and reduced thickness are desirable.

Further, although some of the disclosed methods relate to strengthening soda lime silica glass by removing and/or replacing sodium ions present in the glass, it will be appreciated by one skilled in the art that in certain example embodiments, undesirable ions present in a glass substrate and/or molten glass ribbon may be advantageously removed and/or replaced utilizing plasma as an electrode and/or replacement ion source.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for increasing strength of a glass substrate, the method comprising:
    having at least one plasma torch comprising at least first and second electrodes facing at least a first major surface of the glass substrate;
    spraying a plasma comprising replacement ions through a nozzle of the plasma torch facing the first major surface of the glass substrate via an applied asymmetric varying electric field between the two electrodes such that the plasma is sprayed proximate the first major surface of the glass substrate;
    providing the asymmetric varying electric field between the first and second electrodes, including increasing asymmetry between voltage half-cycles, in order to drive the replacement ions into the glass surface to a depth in the glass substrate of at least 100 micrometers in order to increase the strength of the glass substrate.

2. The method of claim 1, further comprising:
    disposing a second plasma torch comprising third and fourth electrodes facing a second major surface of the glass substrate; and
    spraying a plasma comprising replacement ions through a nozzle of the second plasma torch facing the second major surface of the glass substrate via an applied electric field between the two electrodes such that the plasma is sprayed proximate the second major surface of the glass substrate,
    wherein the replacement ions are driven into the first and second major surfaces of the glass substrate so as to increase the strength of the glass substrate.

3. The method of claim 1, wherein the replacement ions are divalent.

4. The method of claim 1, wherein the replacement ions are multivalent.

5. The method of claim 1, wherein the ions are driven to said depth in about 10 minutes or less.

6. The method of claim 5, wherein the ions are driven to said depth in about 5 minutes or less.

7. The method of claim 1, wherein, after the replacement ions are driven into the glass substrate, the glass substrate has an increased strength of at least 400 MPa.

8. The method of claim 7, wherein said increased strength of the glass substrate is reached in about 10 minutes or less.

9. The method of claim 7, wherein the said increased strength of the glass substrate is at least 600 MPa.

10. The method of claim 1, wherein the glass substrate comprises soda lime silica glass.

* * * * *